(12) United States Patent
Cho

(10) Patent No.: US 12,482,906 B2
(45) Date of Patent: Nov. 25, 2025

(54) SENSING ASSEMBLY AND BATTERY MODULE

(71) Applicant: SK On Co., Ltd., Seoul (KR)

(72) Inventor: Sei Hoon Cho, Daejeon (KR)

(73) Assignee: SK On Co., Ltd., Seoul (KR)

( * ) Notice: Subject to any disclaimer, the term of this patent is extended or adjusted under 35 U.S.C. 154(b) by 283 days.

(21) Appl. No.: 17/470,044

(22) Filed: Sep. 9, 2021

(65) Prior Publication Data

US 2022/0085470 A1 Mar. 17, 2022

(30) Foreign Application Priority Data

Sep. 15, 2020 (KR) ........................ 10-2020-0118359

(51) Int. Cl.
| | |
|---|---|
| *H01M 50/569* | (2021.01) |
| *H01H 85/046* | (2006.01) |
| *H01M 10/48* | (2006.01) |
| *H01M 50/519* | (2021.01) |
| *H01M 50/583* | (2021.01) |
| *H05K 1/02* | (2006.01) |
| *H05K 1/14* | (2006.01) |

(52) U.S. Cl.
CPC ........ *H01M 50/569* (2021.01); *H01H 85/046* (2013.01); *H01M 10/482* (2013.01); *H01M 50/519* (2021.01); *H01M 50/583* (2021.01); *H05K 1/028* (2013.01); *H05K 1/14* (2013.01); *H05K 2201/10037* (2013.01); *H05K 2201/10181* (2013.01)

(58) Field of Classification Search
CPC ............. H01M 50/569; H01M 10/482; H01M 50/519; H01M 50/583; H01M 2200/103; H01M 50/287; H01M 10/425; H01M 50/284; H01H 85/046; H05K 1/028; H05K 1/14; H05K 2201/10037; H05K 2201/10181; H05K 1/147
See application file for complete search history.

(56) References Cited

U.S. PATENT DOCUMENTS

| | | |
|---|---|---|
| 10,396,405 B2 | 8/2019 | Zhao |
| 10,903,469 B2 | 1/2021 | Ju et al. |

(Continued)

FOREIGN PATENT DOCUMENTS

| | | |
|---|---|---|
| CN | 206611639 U | 11/2017 |
| KR | 1020120003432 A | 1/2012 |

(Continued)

*Primary Examiner* — Matthew T Martin
*Assistant Examiner* — Grace Ann Kenlaw
(74) *Attorney, Agent, or Firm* — The Webb Law Firm

(57) ABSTRACT

The present invention relates to a sensing assembly and a battery module that may have a relatively low weight, simplify a component assembly process, reduce manufacturing cost, and prevent a sensing leg from being damaged due to an assembly step or an external force. The sensing assembly may include a first substrate having at least one first terminal and at least one second terminal provided on one surface and formed of a rigid printed circuit board, a second substrate including at least one sensing line electrically connected to the first terminal and formed of a flexible printed circuit board, and a sensing leg having one end electrically connected to the second terminal and including a fuse part that is disconnected when an excessive current flows.

12 Claims, 11 Drawing Sheets

(56) References Cited

U.S. PATENT DOCUMENTS

| | | | |
|---|---|---|---|
| 2012/0019061 A1* | 1/2012 | Nishihara | H01M 10/482 |
| | | | 429/7 |
| 2013/0302651 A1* | 11/2013 | Kim | H01M 10/425 |
| | | | 429/7 |
| 2014/0120401 A1 | 5/2014 | Shin et al. | |
| 2014/0134462 A1 | 5/2014 | Choi et al. | |
| 2018/0198110 A1* | 7/2018 | Zeng | H02H 3/08 |
| 2019/0020012 A1 | 1/2019 | Ju et al. | |
| 2019/0044197 A1 | 2/2019 | Ota et al. | |
| 2019/0181418 A1* | 6/2019 | Son | H01M 50/569 |
| 2019/0189382 A1 | 6/2019 | Holland et al. | |
| 2023/0069153 A1* | 3/2023 | Park | H01M 50/249 |
| 2023/0260675 A1* | 8/2023 | Jung | H01B 3/306 |
| | | | 174/113 R |

FOREIGN PATENT DOCUMENTS

| | | | | |
|---|---|---|---|---|
| KR | 1020160060685 A | 5/2016 | | |
| KR | 1020180022445 A | 3/2018 | | |
| KR | 1020180074457 A | 7/2018 | | |
| KR | 101975976 B1 | 5/2019 | | |
| KR | 101956932 B1 | 6/2019 | | |
| KR | 101996444 B1 | 10/2019 | | |
| KR | 102037045 B1 | 10/2019 | | |
| KR | 1020190112571 A | 10/2019 | | |
| KR | 2116301 B1 * | 6/2020 | | B60L 3/0046 |
| KR | 102116300 B1 | 6/2020 | | |
| KR | 1020200082291 A | 7/2020 | | |
| WO | 2018159928 A1 | 9/2018 | | |

* cited by examiner

-Prior art-

-Prior art-

300

SENSING ASSEMBLY AND BATTERY MODULE

CROSS-REFERENCE TO RELATED APPLICATION

This application claims priority to Korean Patent Application No. 10-2020-0118359 filed Sep. 15, 2020, the disclosure of which is hereby incorporated by reference in its entirety.

BACKGROUND OF THE INVENTION

Field of the Invention

The following disclosure relates to a sensing assembly for measuring a voltage of a battery cell and a battery module to which the sensing assembly is applied.

Description of Related Art

A secondary battery is a device that converts external electrical energy into chemical energy, stores the chemical energy, and generates electricity when needed. The secondary battery has been used in various fields such as electronic devices that use electric power, hybrid vehicles, and electric vehicles.

The secondary battery is manufactured in the form of a battery module in which a plurality of battery cells are stacked in one direction. The sensing assembly senses a voltage by electrically connecting cell tabs formed on both sides of the battery cell to sense the voltage of the battery cell included in the battery module. FIG. 1 illustrates an exploded state of a conventional battery module to which a sensing assembly is applied.

As illustrated in FIG. 1, a battery module 20 to which a sensing assembly 10 is applied may include a battery cell stack 22, an upper cover 21, a bus bar coupling member 23, a first side cover 24, and a second side cover 25, in addition to the sensing assembly 10.

In the battery cell stack 22 illustrated in FIG. 1, battery cells are stacked in one direction, and side surfaces of the battery cells are covered with a cover. The battery cells in the battery cell stack 22 have cell tabs formed on both sides thereof, and the cell tabs formed on both sides of the battery cell are inserted into holes formed in the bus bar coupling member 23 and protrude. A bus bar is formed in the bus bar coupling member 23 and connects between the cell tabs that are inserted into the holes formed in the bus bar coupling member 23 and protrude, and the sensing assembly 10 is connected to the bus bar of the battery cell stack 22 to measure the voltage of the battery cell.

As illustrated in FIG. 1, the sensing assembly 10 includes an FPCB member 13. The FPCB member 13 connects between a front member 11 which is a part connected to the cell tab protruding from one side of the battery cell stack 22, and a rear member 12 which is a part connected to the cell tab protruding from the other side of the battery cell stack 22.

FIG. 2 is an enlarged view of the front member 11 of the sensing assembly 10 illustrated in FIG. 1.

The front member 11 illustrated in FIG. 2 is a kind of synthetic resin injection product, and may be coupled to a first substrate 14. The first substrate 14 may be a rigid printed circuit board (RPCB), and in order to transmit voltage information of a battery cell measured through the sensing assembly 10 to the outside, a connector 15 for connecting an external line and a sensing leg 16 welded to a bus bar may be coupled on one surface of the first substrate 14. Although the sensing leg 16 may have some differences in shape according to a product, a metal plate is basically used. Due to the structural characteristics of the first substrate 14 and the sensing leg 16, the sensing leg 16 may be coupled to the first substrate 14 using a surface mount technology (SMT). As described above, since the sensing leg 16 uses the metal plate, the sensing leg 16 has a certain degree of rigidity, and since both ends of the sensing leg 16 are coupled to the first substrate 14 and the bus bar, respectively, an assembly step may occur between the sensing leg 16 and the bus bar, or when assembled at intervals not intended by a user, there is a high possibility that the sensing leg 16 is deformed due to an external force applied to the sensing leg 16. In particular, when shocks or vibrations are applied to the battery module to which the sensing assembly 10 is applied, a problem such as damage to the sensing leg 16 itself may occur.

In addition, a fuse is installed on the sensing line connected through the sensing leg 16 and the first substrate 14 to block the flow of current when an excessive current flows. There is a problem in that such a fuse complicates a component assembly process, relatively increases a weight, and incurs additional cost.

RELATED ART DOCUMENT

Patent Document

Korean Patent Laid-Open Publication No. 10-2018-0022445

SUMMARY OF THE INVENTION

An embodiment of the present invention is directed to providing a sensing assembly and a battery module capable of having a relatively low weight, simplifying a component assembly process, reducing manufacturing cost, and preventing a sensing leg from being damaged due to an assembly step or an external force.

In one general aspect, a sensing assembly, comprising: a first substrate formed of a rigid printed circuit board and including at least one first terminal and at least one second terminal on one surface, a second substrate formed of a flexible printed circuit board and including at least one sensing line electrically connected to the first terminal and a sensing leg having one end electrically connected to the second terminal and including a fuse part configured to disconnect when an over current flows.

The sensing leg may be formed of a flexible printed circuit board.

The fuse part may be an electrical line printed on the sensing leg, and a width of one end and the other end of the electrical line may be thicker than that of a middle portion connecting the one end and the other end of the electrical line.

The middle portion may have a curved shape.

The sensing assembly may further include: a first electrical connection part provided between one end of the second substrate and the first substrate and electrically connecting the sensing line and the first terminal; and a second electrical connection part provided between one end of the sensing leg and the first substrate and electrically connecting the fuse part and the second terminal.

At least one of the first electrical connection part and the second electrical connection part may be a soldering part formed by soldering.

At least one of the first electrical connection part and the second electrical connection part may be a bonding part bonded with an electrically conductive film.

At least one of the first electrical connection part and the second electrical connection part may be a welding part welded by laser welding or ultrasonic welding.

In another general aspect, A battery module, comprising: a battery cell stack formed of a plurality of battery cells, a bus bar coupling member coupled to both sides of the battery cell stack and a sensing assembly coupled to the bus bar coupling member to sense a voltage of the battery cell, wherein the sensing assembly includes: a first substrate formed of a rigid printed circuit board and including at least one first terminal and at least one second terminal on one surface, a second substrate formed of a flexible printed circuit board and including at least one sensing line electrically connected to the first terminal and a sensing leg having one end electrically connected to the second terminal and including a fuse part configured to disconnect when an over current flows.

The sensing leg may be formed of the flexible printed circuit board.

The fuse part may be an electrical line printed on the sensing leg, and a width of one end and the other end of the electrical line may be thicker than that of a middle portion connecting the one end and the other end of the electrical line.

The middle portion may have a curved shape.

The battery module may further include: a first electrical connection part provided between one end of the second substrate and the first substrate and electrically connecting the sensing line and the first terminal; and a second electrical connection part provided between one end of the sensing leg and the first substrate and electrically connecting the fuse part and the second terminal.

At least one of the first electrical connection part and the second electrical connection part may be a soldering part formed by soldering.

At least one of the first electrical connection part and the second electrical connection part may be a bonding part bonded with an electrically conductive film.

At least one of the first electrical connection part and the second electrical connection part may be a welding part welded by laser welding or ultrasonic welding.

[Detailed Description of Main Elements]

Figure 1:
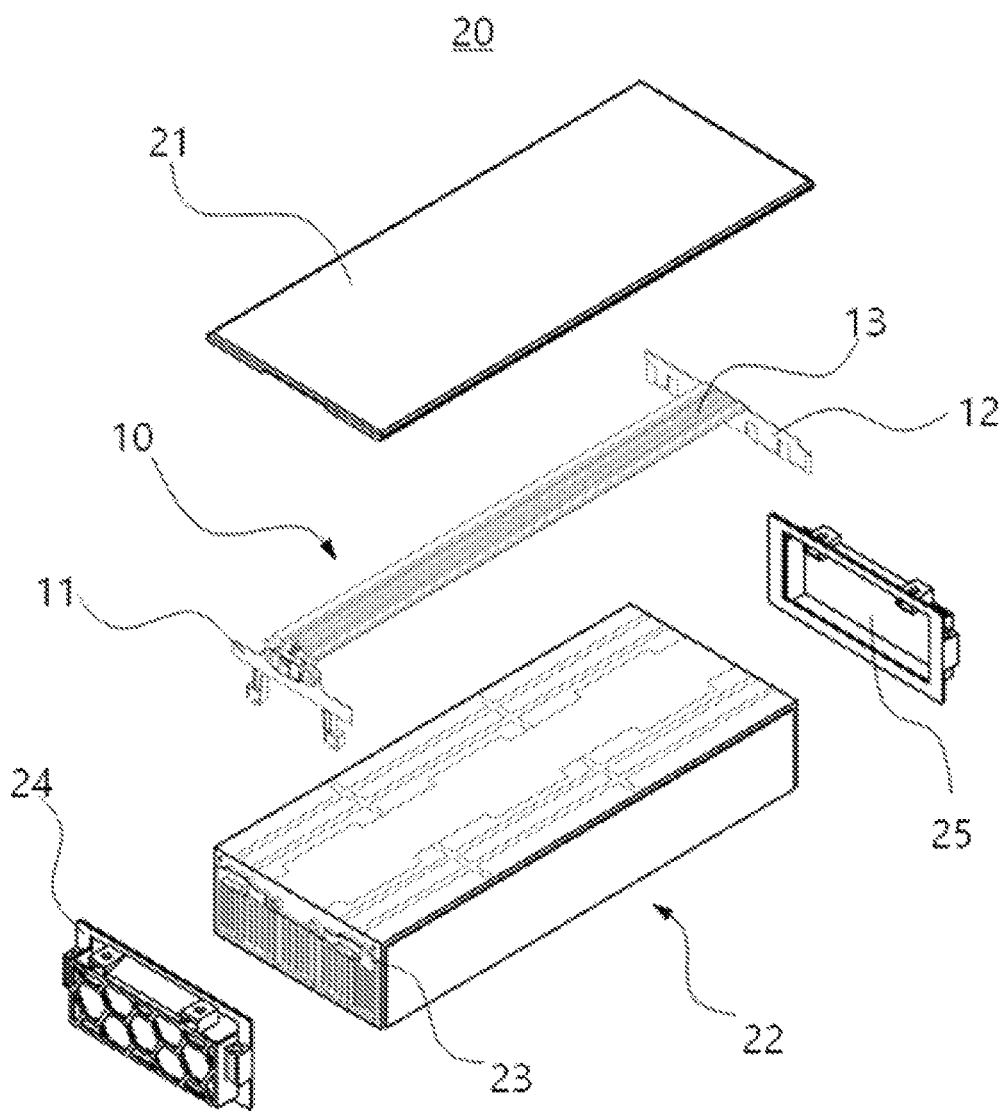
FIG. 1 is an exploded perspective view of a conventional battery module to which a sensing assembly is applied.
Figure 2:
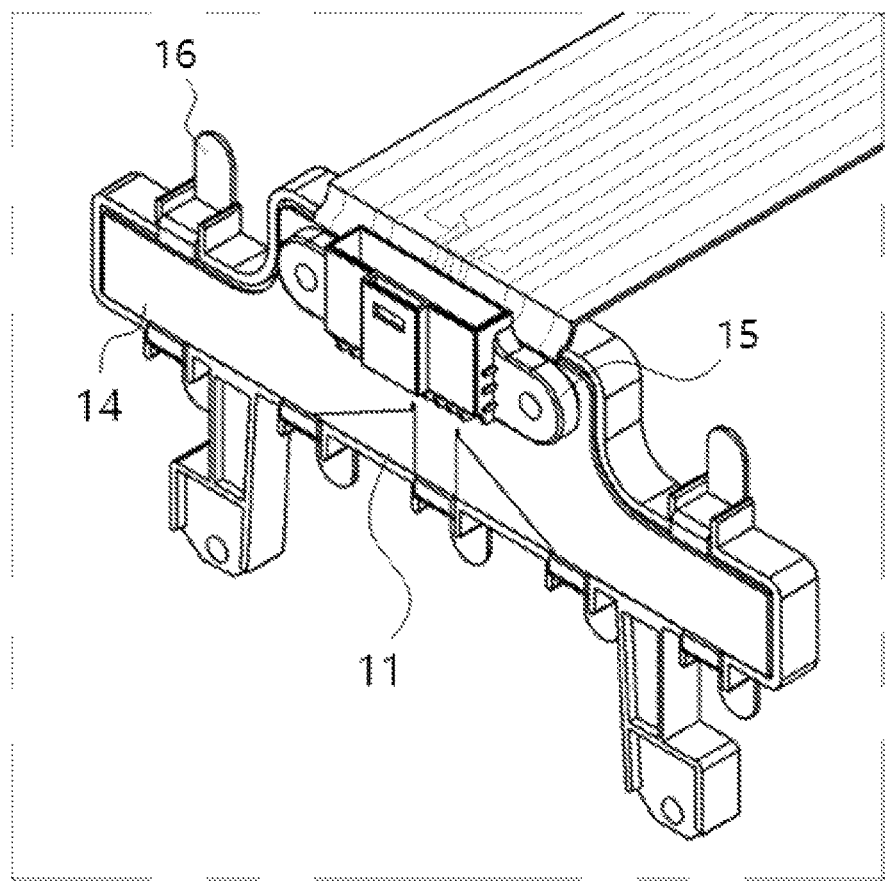
FIG. 2 is an enlarged view of a front member of the sensing assembly illustrated in FIG. 1.

10: Sensing assembly
11: Front member
12: Rear member
13: FPCB member
14: First substrate
15: Connector
16: Sensing leg
20: Battery module
21: Upper cover
22: Battery cell stack
23: Bus bar coupling member
24: First side cover
25: Second side cover
40: RPCB
50: Metal sensing leg
60: ACF film
70: Heating means
100: First substrate
110: Soldering part
121: First terminal
122: Second terminal
200: Second substrate
300: Sensing leg
311: One end of line
312: The other end of line
313: Middle portion
1000: Sensing assembly
L: Sensing line

DESCRIPTION OF THE INVENTION

Hereinafter, a sensing assembly and a battery module including the same according to the present invention will be described in detail with reference to the accompanying drawings. The accompanying drawings are provided by way of example in order to sufficiently transfer the spirit of the present invention to those skilled in the art, and the present invention is not limited to the accompanying drawing provided below, but may be implemented in another form.

Figure 3:
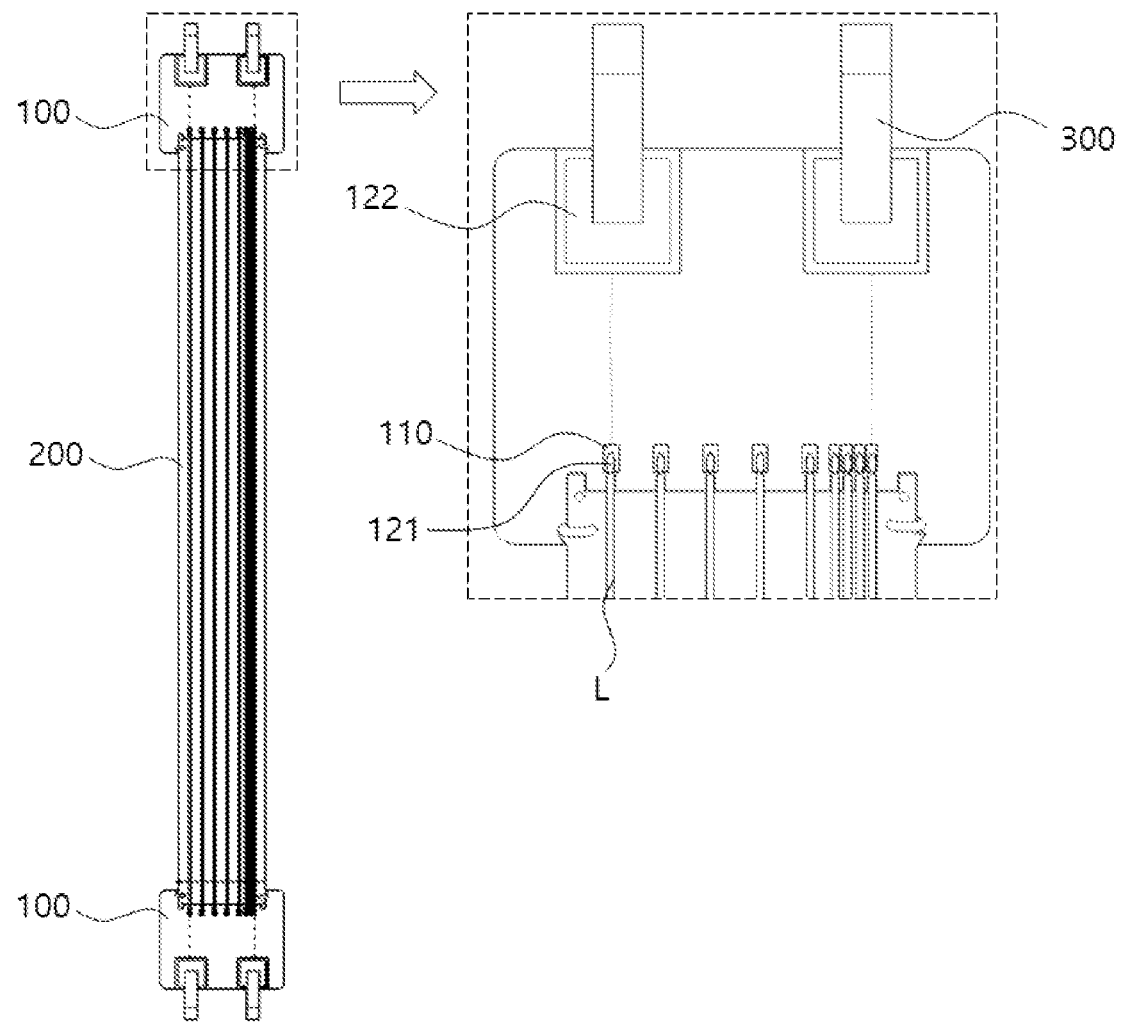
FIG. 3 is a plan view of a sensing assembly according to an embodiment of the present invention.

FIG. 3 schematically illustrates a plane of a sensing assembly according to an embodiment of the present invention.

As illustrated in FIG. 3, the sensing assembly according to the embodiment of the present invention may include a first substrate 100, a second substrate 200, and a sensing leg 300.

As illustrated in FIG. 3, in the present embodiment, a pair of first substrates 100 may be disposed to be spaced apart from each other, and each first substrate 100 may be formed of a rigid printed circuit board (RPCB). As indicated by a dotted line in FIG. 3, a circuit for electrically connecting between the second substrate 200 and the sensing leg 300 to be described later may be printed on a surface or inside of the first substrate 100. The pair of first substrates 100 may each be coupled to front and rear surfaces of a battery cell stack.

A first terminal 121 and a second terminal 122 may be formed on one surface (surface illustrated in FIG. 3) of the first substrate 100. The first terminal 121 is electrically connected to a second substrate 200 to be described later, and the second terminal 122 is electrically connected to a sensing leg 300 to be described later.

As illustrated in FIG. 3, the second substrate 200 connects between the pair of first substrates 100 spaced apart from each other. Unlike the first substrate 100, the second substrate 200 may be formed of a flexible printed circuit board (hereinafter referred to as FPCB). The reason for forming the second substrate 200 of the FPCB is that the FPCB has a relatively thin thickness compared to the RPCB, so a weight of the sensing assembly and the battery module including the same may be reduced. In addition, the second substrate 200 is formed of the FPCB to improve space utilization of the battery module, and even if an assembly error occurs within an allowable tolerance range, the sensing assembly may be manufactured without damage to the second substrate 200 or other members.

As illustrated in FIG. 3, a sensing line L is formed on the second substrate 200, and each sensing line L is formed from one end to the other end of the second substrate 200.

As illustrated in FIG. 3, one end of the second substrate 200 is placed on one surface of the first substrate 100. That is, one end of the second substrate 200 is placed on one surface of the first substrate 100 so that one surface of the first substrate 100 and one surface of the second substrate 200 (one surface on the first substrate 100 side) face each other. The reason why one surface of the first substrate 100 and one surface of the second substrate 200 face each other is to further improve a bonding force between the first substrate 100 and the second substrate 200 when the first substrate 100 and the second substrate 200 are electrically connected to each other. As described above, the first terminal 121 to be connected to the sensing line L of the second substrate 200 is formed on one surface of the first substrate 100. One end of the second substrate 200 is placed on one surface of the first substrate 100 so as to be connected to the first terminal 121 of the first substrate 100, and then the first terminal 121 and the sensing line L may be electrically connected to each other through the first electrical connection part. In an embodiment of the present invention, the first electrical connection part is a soldering part 110 formed through soldering.

Conventionally, there was a case of using both the RPCB and FPCB, but the conventional method is a method of forming a connector on each of the RPCB and FPCB, and connecting the connectors formed on each of the RPCB and FPCB to each other to use the FPCB and the RPCB together. In this method, the process of electrically connecting the connector and the RPCB and the process of electrically connecting the connector and the FPCB are further included, resulting in an increase in production cost compared to the present embodiment.

On the other hand, in the present embodiment, the first substrate 100 and the second substrate 200 are directly connected using the soldering without a separate connector, thereby reducing the production cost and also simplifying the production process compared to the conventional method described above. The method of forming the soldering part 110 through the soldering may be a method of disposing the second substrate 200 on one surface of the first substrate 100 so that the first terminal 121 and the sensing line L come into contact with each other, applying a solder paste to a portion where the first terminal 121 and the sensing line L come into contact with each other, and then exposing the first substrate 100 and the second substrate 200 to a heated space like a kind of oven for a predetermined time, or applying hot air to a portion to which the solder paste is applied. In this way, since the soldering part 110 can be formed on the plurality of first substrates 100 and the second substrate 200 at the same time, mass productivity may be improved.

In the present invention, the method for connecting the first terminal 121 and the sensing line L is not limited to the above-described soldering method, but there may be a method of forming a bonding part through an electrically conductive film, or forming a welding part using ultrasonic welding or laser welding to electrically connect the first terminal 121 and the sensing line L to each other and form the first electrical connection part. Here, the electrically conductive film means a film capable of electrically connecting two members to which the film is attached to each other, and as an example of the electrically conductive film, there may be an anisotropic conductive film (hereinafter referred to as ACF). After the ACF is disposed between the two members to be electrically connected, the bonding part is formed as the first electrical connection part by pressing and heating the stacked two members and the ACF, thereby electrically connecting the two different members. A detailed method of using the ACF in the present invention will be described later.

Figure 4:
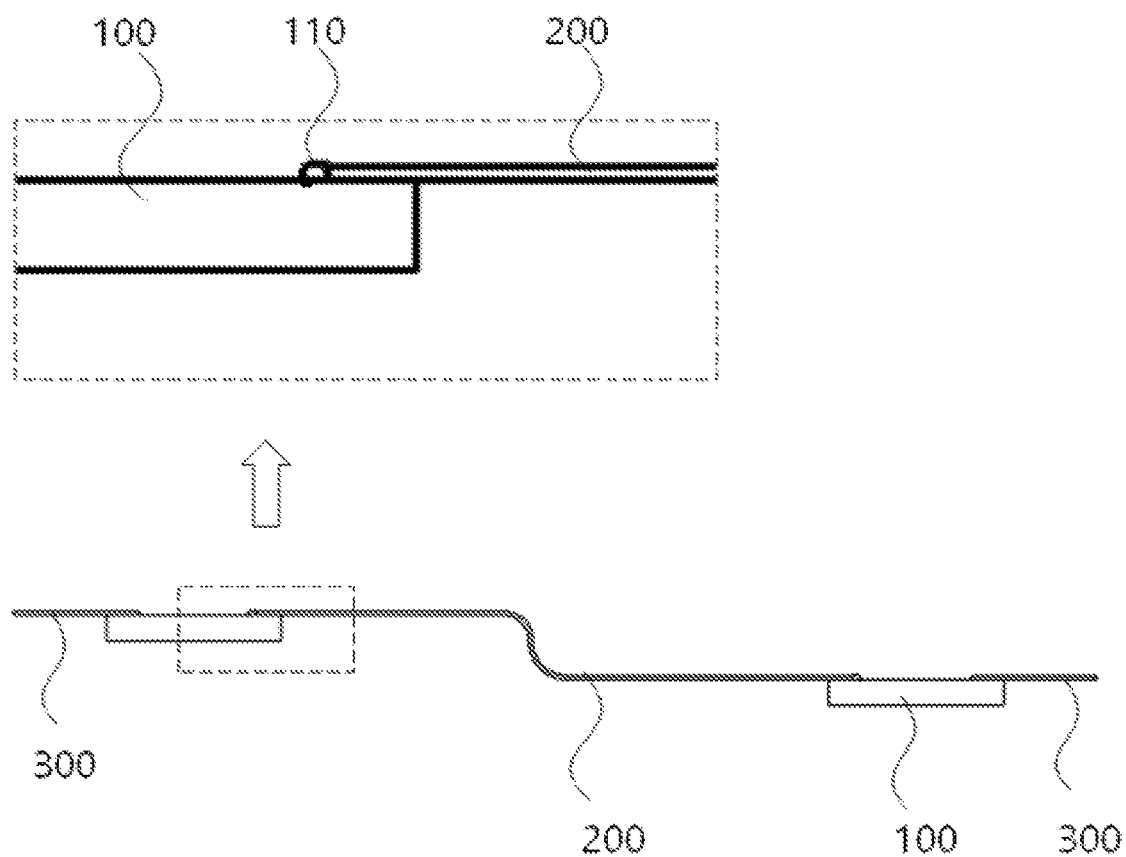
FIG. 4 is a side view of a state in which a second substrate of the sensing assembly according to the embodiment of the present invention is bent.

FIG. 4 schematically illustrates a side of the sensing assembly illustrated in FIG. 3 according to an embodiment of the present invention.

As illustrated in FIG. 4, the second substrate 200 included in the sensing assembly according to the embodiment of the present invention is formed of the FPCB and may be flexibly bent or folded. Therefore, when the sensing assembly according to the present invention is applied to the battery cell stack, even if an assembly error occurs, stress is not concentrated on the second substrate 200, so the sensing assembly may be easily applied to the battery cell stack without worrying about damage to the second substrate 200 or other members.

As illustrated in FIG. 3, one end of the sensing leg 300 may be electrically connected to the second terminal 122 formed on one surface of the first substrate 100 through the second electrical connection part. Here, the sensing leg 300 is a terminal capable of sensing a voltage or temperature of a battery cell, and may also be referred to as a sensing terminal, a sensing terminal, or the like. In addition, when included in the battery module, the sensing leg 300 may be configured to be coupled to a bus bar for sensing a cell voltage. In the present invention, the sensing leg 300 may be formed of the FPCB like the second substrate 200. In the present invention, the sensing leg 300 is formed of the FPCB, so that when the sensing assembly is coupled to the battery module, a certain level of assembly step occurs, and thus, the sensing leg 300 may be prevented from being damaged even if an external force is applied to the sensing leg 300, and has strength in unexpected shocks and vibrations from the outside.

The method of forming a second electrical connection part for electrically connecting the sensing leg 300 and the second terminal 122 may be a method of forming a soldering part using soldering like the method of forming the first electrical connection part between the first substrate 100 and the second substrate 200 in the present embodiment. However, in the present invention, the method of electrically connecting the sensing leg 300 and the second terminal of the first substrate 100 is not limited to the soldering, and the bonding part may be formed using an electrically conductive film, or the welding part may be formed using ultrasonic welding or laser welding. After one surface of the sensing leg 300 also faces one surface of the first substrate 100, the second electrical connection part may be formed using at least one of the soldering, the electrically conductive film, the ultrasonic welding, and the laser welding to electrically connect the sensing leg 300 and the first substrate 100 to each other, which is to increase the bonding force between the sensing leg 300 and the first substrate 100.

The sensing line formed on the second substrate 200 of the present invention, the first terminal 121 and the second terminal 122 formed on the first substrate 100, and the sensing leg 300 may be electrically connected to each other, and it is possible to sense the voltage, temperature, and the like of the battery cell through this electrical connection.

Figure 5:
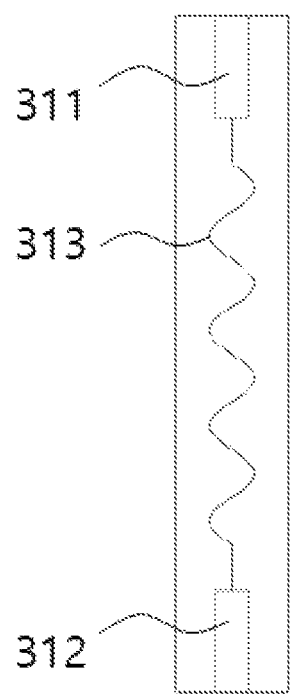
FIG. 5 is a plan view of a sensing leg of the sensing assembly according to the embodiment of the present invention.

FIG. 5 illustrates only the sensing leg 300.

As illustrated in FIG. 5, the fuse part may be formed on the sensing leg 300. The fuse part may be a kind of electrical line, and may be patterned and printed on the sensing leg 300. The fuse part may be formed so that a width of one end 311 and the other end 312 of the line is thicker than that of a middle portion 313 connecting one end and the other end. One of the one end 311 of the line and the other end 312 of the line may be a portion connected to the second terminal 122 of the first substrate 100 described above, and the other may be a portion connected to the bus bar. The reason that the width of the middle portion 313 is thinner than that of one end 311 of the line and the other end 312 of the line is to cut off the middle portion 313 when an excessive current flows through the fuse part. The middle portion 313 may have a shape in which an S-shaped curved shape is repeatedly continued. The above-described fuse part may be electrically connected to the sensing line L of the second substrate 200.

The welding which is a method of connecting the other end of the sensing leg 300 and the bus bar, and the soldering for coupling the first substrate 100 and the second substrate 200 may share a significant part of the process, so convenience and economic feasibility may be improved in manufacturing the sensing assembly according to the embodiment of the present invention.

When the method of electrically connecting the first substrate 100 and the second substrate 200 in the present invention is a method other than the soldering, by replacing the same method of electrically bonding the first substrate 100 and the sensing leg 300 with the method of electrically bonding the first substrate 100 and the second substrate 200 to each other, even if a method other than the soldering is used, convenience and economic feasibility may be improved in manufacturing the sensing assembly according to the embodiment of the present invention.

Figure 6A:
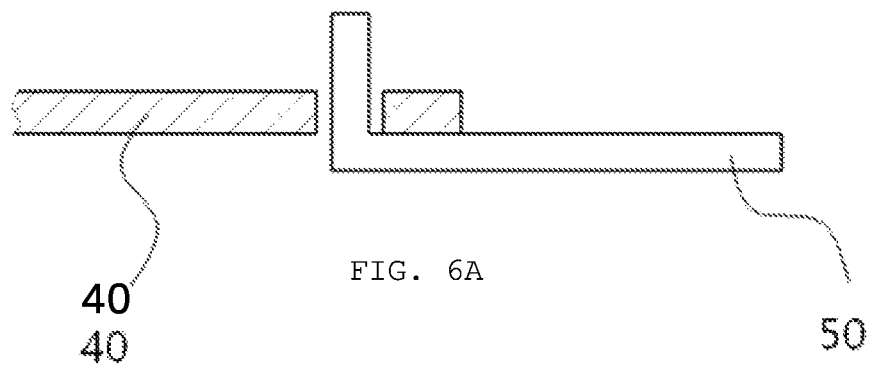
FIGS. 6A to 6C are side schematic views of the sensing leg of the sensing assembly according to the embodiment of the present invention and the related art.
Figure 6B:
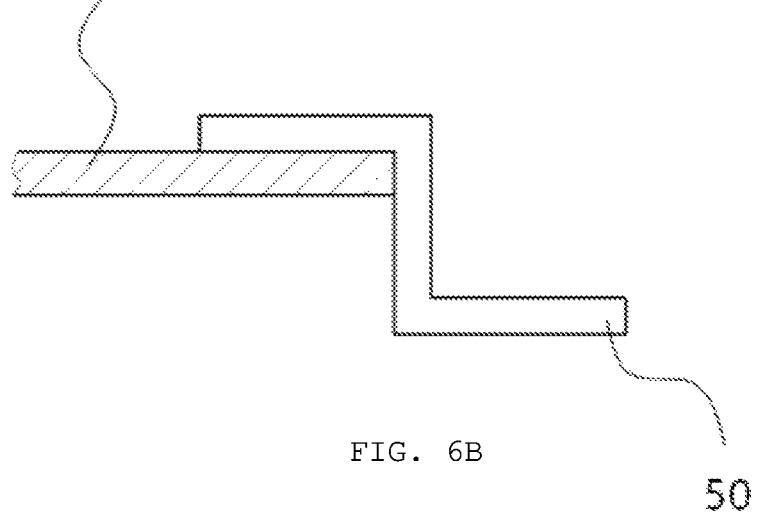
Figure 6C:
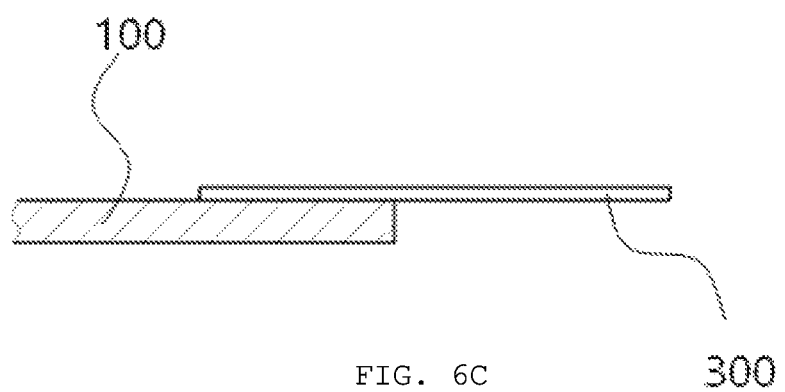

FIGS. 6A to 6C schematically illustrate two methods in which the conventional sensing leg is coupled to a substrate, and a case in which the sensing leg in the sensing assembly according to the embodiment of the present invention is coupled, in order to explain in more detail why the sensing leg 300 is formed of an FPCB. The method illustrated in FIGS. 6A and 6B is the conventional method, and FIG. 6C is the method according to the present embodiment.

First, in the method illustrated in FIG. 6A, after processing a hole in the RPCB 40, one end of the metal sensing leg 50 made of metal is inserted into the hole, and the circuit printed on the RPCB 40 and the metal sensing leg 50 are electrically connected to each other through the soldering. Here, the metal sensing leg 50 may be generally manufactured using copper. The method illustrated in FIG. 6A requires a process of forming a separate groove in the RPCB 40, and when an assembly error occurs, stress is applied to the metal sensing leg 50, and thus, the metal sensing leg 50 may be damaged. In addition, the metal sensing leg 50 is generally manufactured using a mold. In order to apply the sensing assembly to battery cell stacks having different specifications, the metal sensing leg 50 applied to each battery cell stack also needs to be manufactured in different specifications, so molds of various specifications are needed. In general, since high cost is required to newly manufacture one mold, the method illustrated in FIG. 6A is not economical, and the metal sensing leg 50 manufactured in this way has no versatility.

The method illustrated in FIG. 6B is a method of connecting the metal sensing leg 50 to the RPCB 40 through the soldering after placing the metal sensing leg 50 without machining the hole in the RPCB 40. In this method, as compared to the method illustrated in FIG. 7A, since the process of machining the hole in the RPCB 40 is omitted, manufacturing convenience and economic feasibility may be improved, but, like the method illustrated in FIG. 7A, there is a possibility of damage to the metal sensing leg 50 due to the assembly error, and there is also a problem that there is no versatility.

On the other hand, since the sensing leg 300 of the present invention illustrated in FIG. 6C is formed of the FPCB instead of metal such as copper, when the sensing leg 300 is formed only over a certain length, the sensing leg 300 may be applied to the battery module including the battery cell stack of various specifications, and even if the assembly error occurs, stress is not applied to the sensing leg 300 (or stress is applied to a certain degree or less), so the sensing leg is less likely to be damaged and is easily assembled into the battery cell stack.

Figure 7:
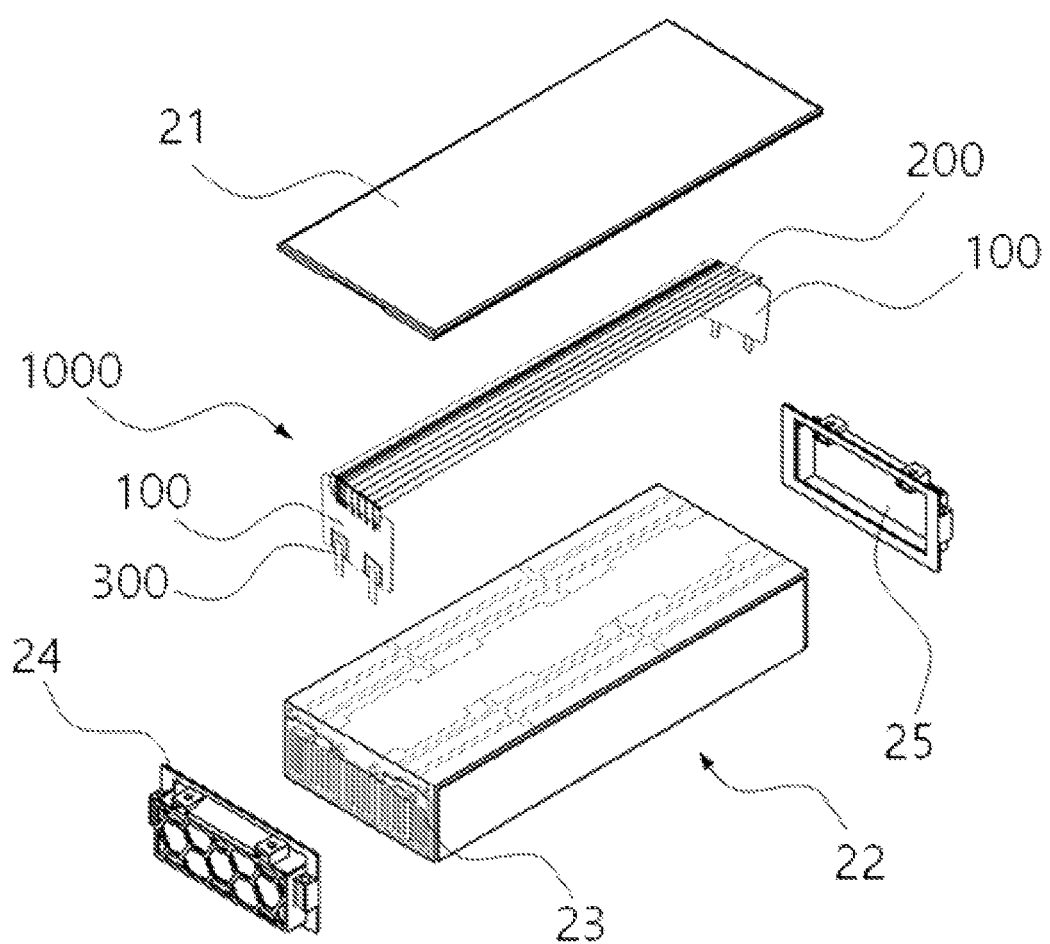
FIG. 7 is an exploded perspective view of a battery module including the sensing assembly according to the embodiment of the present invention.

FIG. 7 is an exploded perspective view of a battery module according to an embodiment of the present invention.

As illustrated in FIG. 7, the battery module according to the embodiment of the present invention may include a battery cell stack 22, a bus bar coupling member 23 and a sensing assembly 1000, and in addition to this, may further include an upper cover 21, a first side cover 24, and a second side cover 25. Among the above-described components, the sensing assembly 1000 is the same as the sensing assembly according to the present invention described above. Accordingly, the sensing assembly 1000 may include the first substrate 100, the second substrate 200, and the sensing leg 300, and a detailed description of the sensing assembly 1000 will be omitted. Among the components included in the battery module according to the embodiment of the present invention, other components except for the sensing assembly 1000 are the same as those described in the description of the background of the present invention.

Hereinafter, a method of manufacturing a sensing assembly according to an embodiment of the present invention will be described in detail with reference to the accompanying drawings.

The method of manufacturing a sensing assembly according to an embodiment of the present invention may include steps a) and b). In step a), the pair of first substrates 100 each having at least one first terminal 121 formed on one surface are disposed to be spaced apart from each other, and in step b), the sensing line L is formed, the second substrate formed of the flexible circuit board is disposed between the first substrates 100, and the sensing line L and the first terminal 121 are electrically connected to form the first electrical connection part.

As described above, the first electrical connection part is formed using various methods such as the soldering, the electrically conductive film, the ultrasonic welding, and the laser welding, and the sensing line L and the first terminal 121 may be electrically connected. A method of electrically connecting the sensing line L and the first terminal 121 using the soldering has already been described, and in the present embodiment, the connection method using ACF, which is a kind of electrically conductive film, will be described.

Figure 8:
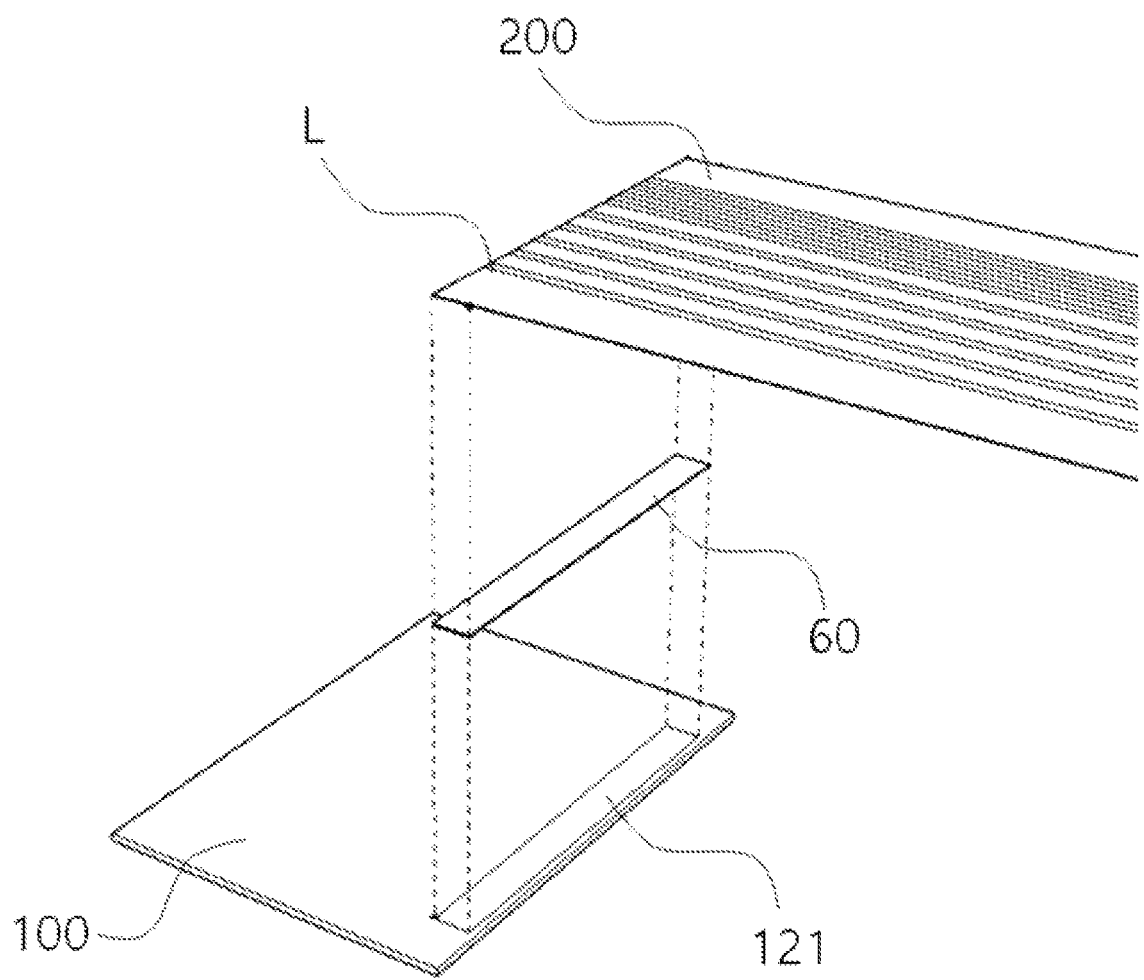
FIGS. 8 and 9 are schematic views of step b) of a method of manufacturing a sensing assembly according to an embodiment of the present invention.
Figure 9:
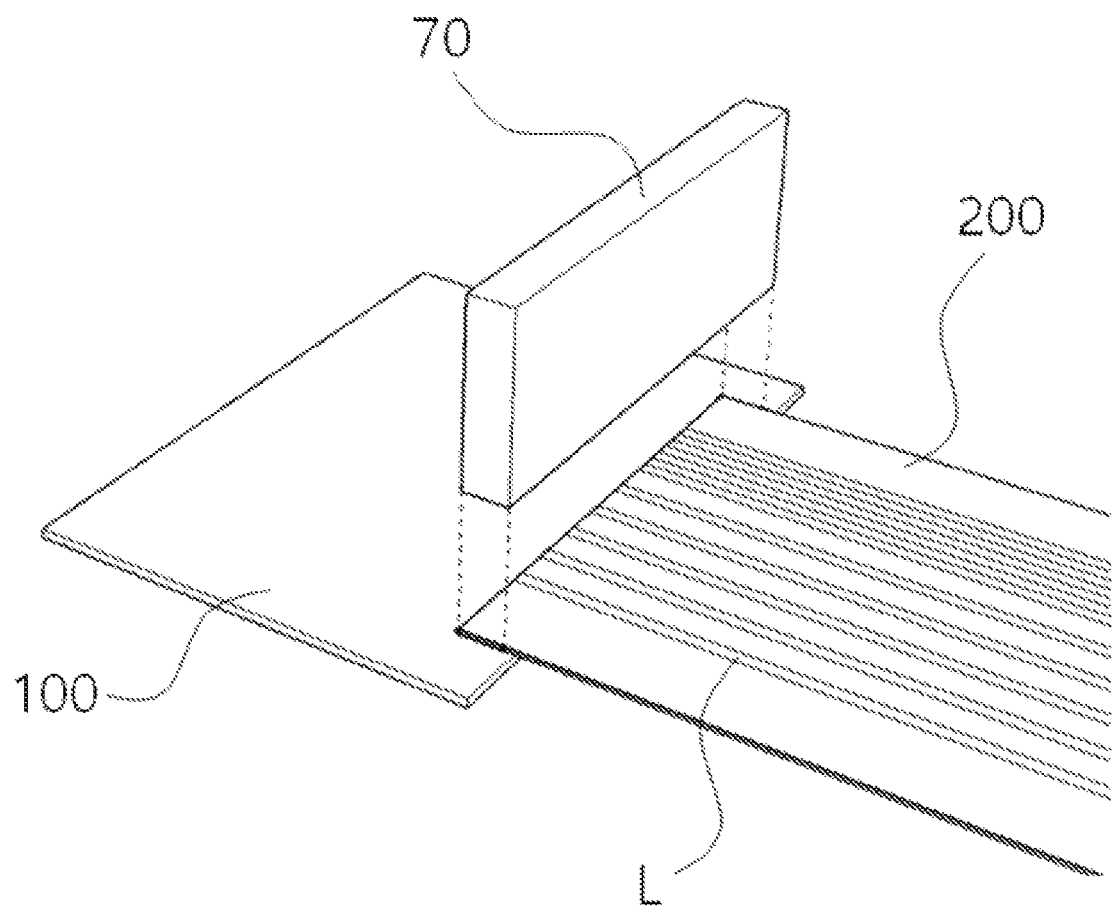

FIG. 8 illustrates a state in which the ACF 60 is disposed between the first substrate 100 on which the first terminal 121 is formed and the second substrate 200 on which the sensing line L is formed in step b). When the first substrate 100, the ACF 60, and the second substrate 200 illustrated in FIG. 8 are stacked in step b) of the present embodiment, the state illustrated in FIG. 9 is obtained, after moving the bar-shaped heating means 70 to face the stacked portion, by pressing and heating the portion where the first terminal 121, the ACF 60, and the sensing line L are stacked to a predetermined pressure or more, the bonding part formed of the ACF 60 is formed, and thus, the first terminal 121 and the sensing line L may be electrically connected to each other. That is, in the present embodiment, the bonding part formed of the ACF 60 is the first electrical connection part. As described above, the electrical connection method using the ACF 60 has an advantage in that the heating means 70 can be miniaturized and may be performed in a relatively narrow space.

The method of manufacturing a sensing assembly according to an embodiment of the present invention may further include steps c).

Figure 10:
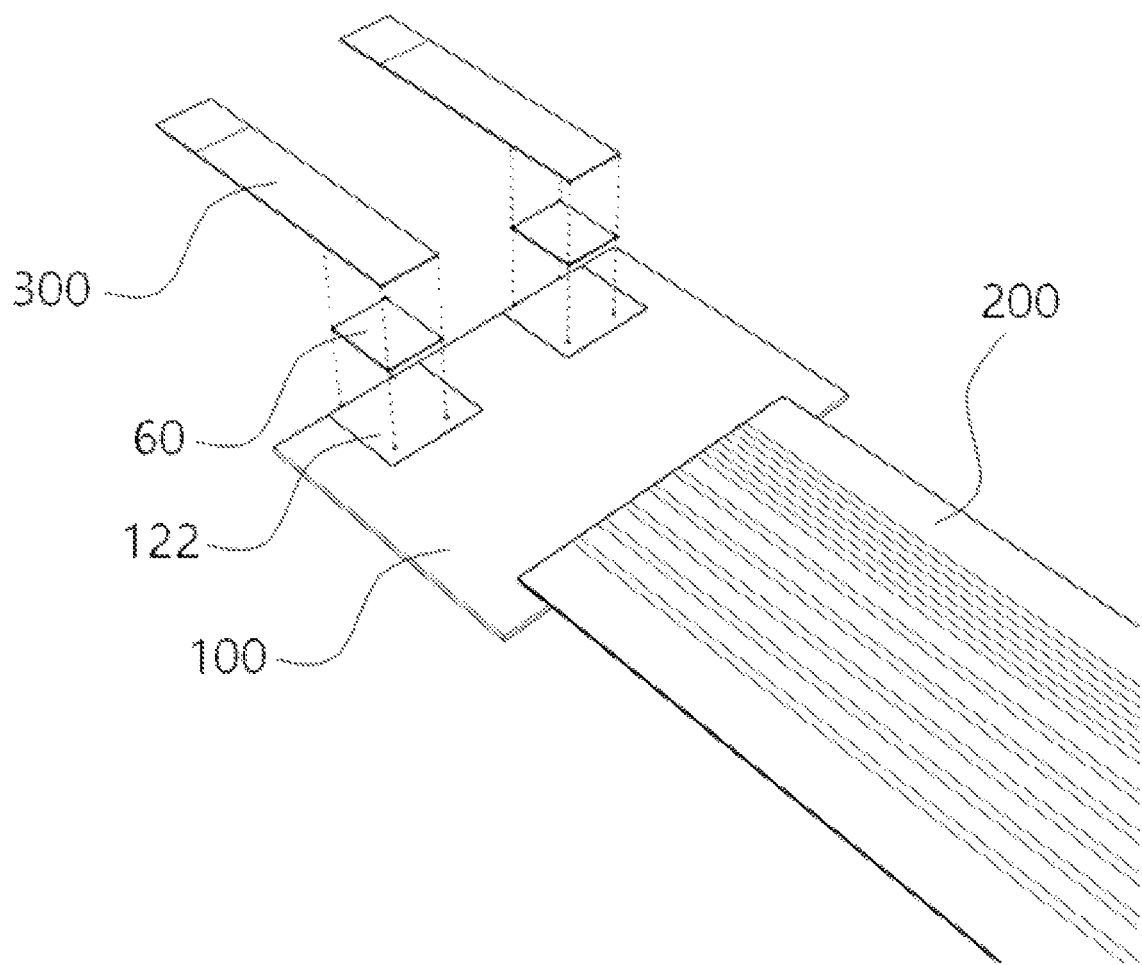
FIGS. 10 and 11 are schematic views of step c) of the method of manufacturing a sensing assembly according to the embodiment of the present invention.
Figure 11:
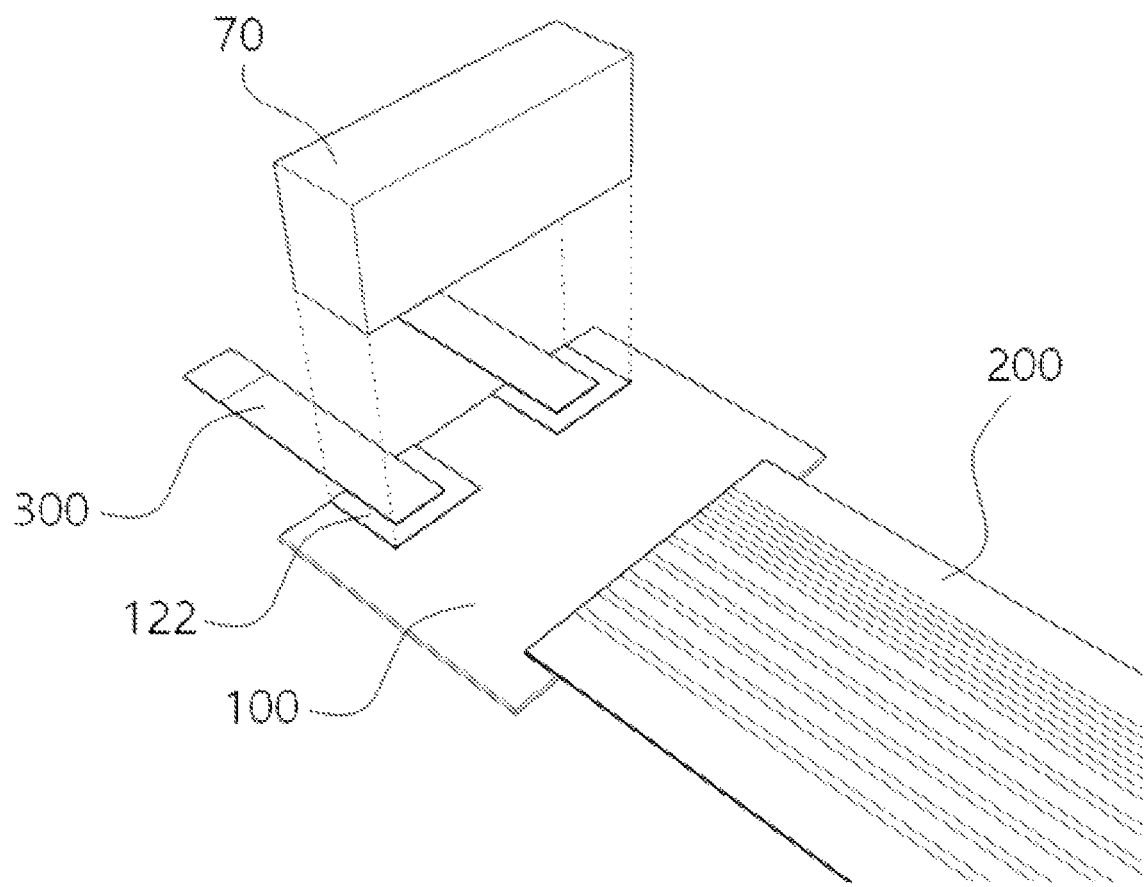

FIGS. 10 and 11 sequentially illustrate a process in which step c) of a method for manufacturing a sensing assembly according to an embodiment of the present invention is performed.

As illustrated in FIG. 10, in step c), one end of the sensing leg 300 formed of the FPCB and the first substrate 100 are spaced apart from each other, and the ACF 60 is disposed between the second terminal formed on the surface of the first substrate 100 and the sensing leg 300. The state in which the second terminal 122, the ACF 60, and the sensing leg 300 are stacked on each other is illustrated in FIG. 12. Thereafter, in step c), the bonding part is formed by pressing and heating the second terminal 122, the ACF 60, and the sensing leg 300 stacked on each other using the heating means 70 to a predetermined pressure or more. The bonding part formed through the above-described process becomes a second electrical connection part for electrically connecting the second terminal 122 and the sensing leg 300. However, the present invention does not limit the process of forming the second electrical connection part in step c) to the above-described embodiment, and in step c), similarly to step b) of forming the first electrical connection part, the soldering part using the soldering, the welding part using the ultrasonic welding or the laser welding may be formed to form the second electrical connection part.

Step c) may be performed regardless of the order of steps a) and b) described above. That is, after the sensing leg 300 is electrically connected to the first substrate 100, the first substrate 100 and the second substrate 200 may be electrically connected to each other.

According to a sensing assembly and a battery module according to the present invention as described above, a sensing leg coupled to a bus bar of the battery module to sense a voltage of a battery cell is formed of a flexible circuit board, thereby preventing the sensing leg from being damaged due to an assembly step or an external force.

In addition, since the fuse part is patterned on the sensing leg, it is possible to reduce weight, simplify a manufacturing process, and reduce manufacturing cost, compared to the conventional method in which a separate fuse is provided.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the scope and spirit of the present invention should be understood only by the following claims, and all of the equivalences and equivalent modifications to the claims are intended to fall within the scope and spirit of the present invention.

What is claimed is:

1. A sensing assembly, comprising:
   two first substrates, each of the first substrates formed of a rigid printed circuit board and each of the first substrates including at least one first terminal and at least one second terminal on one surface;
   a second substrate formed of a flexible printed circuit board and comprising at least one sensing line electrically connected to the first terminal formed on each of the two first substrates and connecting the two first substrates; and
   two sensing legs, wherein a first of the two sensing legs is electrically connected between the second terminal formed on a first one of the two first substrates and a first one of two bus bars included in a battery cell stack, a second of the two sensing legs is electrically connected between the second terminal formed on a second one of the two first substrates and a second one of the two bus bars included in the battery cell stack, and each of the two sensing legs comprises a fuse part configured to disconnect when an over current flows,
   wherein the two sensing legs are formed of a flexible printed circuit board,
   wherein one surface of each of the two sensing legs faces one surface of a corresponding first substrate to form an electrical connection part and is electrically connected to the second terminal of the corresponding first substrate through the electrical connection part,
   wherein each of the two sensing legs is directly connected to each of the two bus bars through welding,
   wherein, the two first substrates include one first substrate adjacent to a first bus bar connected to a first cell tab provided at one side of a battery cell, and another first substrate adjacent to a second bus bar connected to a second cell tab provided at the other side of the battery cell,
   wherein, the second substrate connects the one first substrate and the other first substrate, and
   wherein, the two sensing legs include a first sensing leg connecting the one first substrate and the first bus bar, and a second sensing leg connecting the other first substrate and the second bus bar.

2. The sensing assembly of claim 1, wherein the fuse part of each of the two sensing legs is an electrical line printed on the sensing leg, and
   a width of one end and an other end of the electrical line is thicker than that of a middle portion connecting the one end and the other end of the electrical line.

3. The sensing assembly of claim 2, wherein the middle portion has a curved shape.

4. The sensing assembly of claim 1, further comprising:
   a first electrical connection part provided between one end of the second substrate and one of the first substrates and electrically connecting the sensing line and the first terminal; and a second electrical connection part provided between one end of one of the sensing legs and the first substrate and electrically connecting the fuse part and the second terminal.

5. The sensing assembly of claim 4, wherein at least one of the first electrical connection part and the second electrical connection part is a soldering part formed by soldering.

6. A battery module, comprising:
- a battery cell stack formed of a plurality of battery cells and having cell tabs formed on both sides of the battery cell stack;
- two bus bar coupling members coupled to the both sides of the battery cell stack, the two bus bar coupling members including holes into which the cell tabs are inserted and two bus bars are connected to the cell tabs; and
- a sensing assembly coupled to the two bus bar coupling members to sense a voltage of the battery cell stack, wherein the sensing assembly comprises:
- two first substrates formed of a rigid printed circuit board and each of the first substrates comprising at least one first terminal and at least one second terminal on one surface;
- a second substrate formed of a flexible printed circuit board and comprising at least one sensing line electrically connected to the first terminal formed on each of the two first substrates and connecting the two first substrates; and
- two sensing legs, wherein a first of the two sensing legs is electrically connected between the second terminal formed on a first one of the two first substrates and a first one of the two bus bars included in a battery cell stack, a second of the two sensing legs is electrically connected between the second terminal formed on a second one of the two first substrates and a second one of the two bus bars included in the battery cell stack, and each of the two sensing legs comprises a fuse part configured to disconnect when an over current flows, wherein the two sensing legs are formed of a flexible printed circuit board, wherein one surface of each of the two sensing legs faces one surface of a corresponding first substrate to form an electrical connection part and is electrically connected to the second terminal of the corresponding first substrate through the electrical connection part, wherein each of the two sensing legs is directly connected to each of the two bus bars through welding, wherein, the two first substrates include one first substrate adjacent to a first bus bar connected to a first cell tab provided at one side of the battery cell, and another first substrate adjacent to a second bus bar connected to a second cell tab provided at the other side of the battery cell, wherein, the second substrate connects the one first substrate and the other first substrate, and wherein, the two sensing legs include a first sensing leg connecting the one first substrate and the first bus bar, and a second sensing leg connecting the other first substrate and the second bus bar.

7. The battery module of claim 6, wherein the fuse part of each of the two sensing legs is an electrical line printed on the sensing leg, and
a width of one end and an other end of the electrical line is thicker than that of a middle portion connecting the one end and the other end of the electrical line.

8. The battery module of claim 7, wherein the middle portion has a curved shape.

9. The battery module of claim 6, further comprising:
- a first electrical connection part provided between one end of the second substrate and one of the first substrates and electrically connecting the sensing line and the first terminal; and
- a second electrical connection part provided between one end of one of the sensing legs and the first substrate and electrically connecting the fuse part and the second terminal.

10. The battery module of claim 9, wherein at least one of the first electrical connection part and the second electrical connection part is a soldering part formed by soldering.

11. The sensing assembly of claim 1, wherein, each first substrate is provided on one side of the battery cell, and the sensing leg of each first substrate is formed in a straight line along the vertical direction.

12. The sensing assembly of claim 6, wherein, each first substrate is provided on one side of the battery cell, and the sensing leg of each first substrate is formed in a straight line along the vertical direction.

* * * * *